US 8,268,651 B2

(12) United States Patent
Kim

(10) Patent No.: US 8,268,651 B2
(45) Date of Patent: Sep. 18, 2012

(54) MANUFACTURING METHOD OF LIGHT EMITTING DIODE PACKAGE

(75) Inventor: Hong Min Kim, Kyungki-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 12/618,445

(22) Filed: Nov. 13, 2009

(65) Prior Publication Data

US 2010/0120182 A1      May 13, 2010

Related U.S. Application Data

(62) Division of application No. 11/478,621, filed on Jul. 3, 2006, now Pat. No. 7,687,815.

(30) Foreign Application Priority Data

Jul. 4, 2005   (KR) .................. 10-2005-0059590

(51) Int. Cl.
*H01L 21/00* (2006.01)
(52) U.S. Cl. .......... 438/27; 257/678; 257/291; 257/292; 257/293
(58) Field of Classification Search .............. 257/678, 257/291, 292, 293; 438/27
See application file for complete search history.

(56) References Cited

U.S. PATENT DOCUMENTS

| | | | |
|---|---|---|---|
| 6,066,861 A | 5/2000 | Hohn et al. | |
| 6,614,103 B1 * | 9/2003 | Durocher et al. | 257/678 |
| 2002/0167485 A1 * | 11/2002 | Hedrick | 345/156 |
| 2005/0093146 A1 | 5/2005 | Sakano | |

FOREIGN PATENT DOCUMENTS

| | | |
|---|---|---|
| JP | 10-215001 | 8/1998 |
| JP | 11-500584 | 1/1999 |
| JP | 2002-190619 | 7/2002 |
| JP | 2003-273405 | 9/2003 |
| JP | 2005-19919 A | 1/2005 |
| JP | 2005-109289 | 4/2005 |
| JP | 2005-159311 | 6/2005 |

OTHER PUBLICATIONS

Chinese Office Action issued in corresponding Chinese Patent Application No. 200610095798, dated on Sep. 7, 2007.

* cited by examiner

*Primary Examiner* — Jay C Kim
*Assistant Examiner* — Dale E Page
(74) *Attorney, Agent, or Firm* — McDermott Will & Emery LLP

(57) ABSTRACT

The invention provides a side-view LED having an LED window opened to a side to emit light sideward. A pair of lead frames each act as a terminal. An LED chip is attached to a portion of the lead frame and electrically connected thereto. A package body houses the lead frames and has a concave formed around the LED chip. Also, a high reflective metal layer is formed integrally on a wall of the concave. A transparent encapsulant is filled in the concave to encapsulate the LED chip, while forming the LED window. In addition, an insulating layer is formed on a predetermined area of the lead frames so that the lead frames are insulated from the high reflective metal layer. The side-view LED of the invention enhances light efficiency and heat release efficiency with an improved side-wall reflection structure.

4 Claims, 10 Drawing Sheets

MANUFACTURING METHOD OF LIGHT EMITTING DIODE PACKAGE

CROSS-REFERENCE TO RELATED APPLICATIONS

This application is a Divisional of U.S. application Ser. No. 11/478,621, filed on Jul. 3, 2006, claiming priority of Korean Application No. 2005-0059590, filed on Jul. 4, 2005, the entire contents of each are hereby incorporated by reference.

BACKGROUND OF THE INVENTION

1. Field of the Invention

The present invention relates to a side-view light emitting diode (LED) having an LED window opened to a side to emit light sideward. More particularly, the present invention relates to a side-view LED having an improved sidewall reflection structure, thereby enhancing light efficiency and heat release efficiency.

2. Description of the Related Art

A liquid crystal device (LCD) mounted in monitors, mobile phones and Personal Digital Assistants (PDAs) requires external light due to absence of its own light source. Besides, the LCD generally employs a backlight device as a lighting device. The backlight device illuminates the LCD from the back, using Cold Cathode Fluorescent Lamp (CCFL) and Light Emitting Diode (LED) as a light source.

Meanwhile, the backlight device mounted in a small LCD for e.g., mobile phones and PDAs adopt a side-view LED as a light source. Such a side-view LED has an LED window opened to a side to emit light sideward and typically mounted in a backlight device as shown in FIG. 1.

Referring to FIG. 1, the backlight device 50 has a flat light guide plate 54 formed on a substrate 52. Also, a plurality of side-view LEDs 1 (only one LED illustrated) are arrayed on a side of the light guide plate 54. Light L incident onto the light guide plate 54 from the LEDs is reflected upward by a reflective sheet 56 from a micro dot pattern formed on the light guide plate 54. Then the light L exits from the light guide plate 54 to provide a back light to a liquid panel 58 over the light guide panel 54.

FIG. 2 is a front view illustrating an example of a conventional LED 1 as shown in FIG. 1. FIG. 3 is a cross-sectional view cut along the line of FIG. 2.

Referring to FIGS. 2 and 3, the LED 1 includes a package body 10, a pair of lead frames 20 and 22 disposed inside the package body 10 and an LED chip 30 disposed on the lead frames 20.

The package body 10 typically fabricated by molding a high reflective resin is divided into a front part 10a and a rear part 10b with respect to the lead frames 20 and 22. In the front part 10a, a concave 12 and a wall 14 defining the concave 12 are formed. The concave 12 is flat in bottom and widened upwards, as in FIG. 3 so that it is shaped as V or U having a flat bottom (cut in half vertically). The concave 12 is designed to direct light generated from the LED chip 30 along an arrow A direction of FIG. 3. Due to such a concave 12, the wall 14 is narrowed along the arrow A direction, and an inner surface 16 of the wall 14 is inclined.

Also, a transparent encapsulant 40 is filled in the concave 12 to seal the LED chip 30 from the outside. The encapsulant 40 may contain fluorescent material for converting light or ultraviolet ray generated in the LED chip 30 into e.g., white light.

The LED chip 30 is electrically connected to the lead frames 20 and 22 by wires W. In addition, the lead frames 20 and 22 have some portions thereof extending outside the package body 10 to form external terminals.

The conventional LED 1 is accompanied by drawbacks as follows.

The package body 10 is made of a material having a reflectivity of substantially 75%. That is, when light generated from the LED chip 30 is reflected on the inner surface 16 of the wall 14, some considerable portion of the light is absorbed therein, and other portion of the light transmits the wall 14. Disadvantageously, this reduces an amount of light irradiated from the LED 10 forward, i.e., in an arrow A direction.

Also, light absorbed in the inner surface 16 of the wall 14, or light absorbed during its transmission of the wall 14 is converted into heat, thereby increasing temperature of the wall 14. Such thermal conversion of light occurs especially intensively on the inner surface 16 of the wall 14. Consequently this raises temperature of the inner surface 16 and its surrounding area, i.e., the wall 14 and the transparent encapsulant 40. This adversely affects the wall 14, particularly the transparent encapsulant 40.

To overcome problems of the conventional side-view LED, side-view LEDs shown in FIGS. 4 to 6 were proposed. FIG. 4 is a front view illustrating other example of the conventional side-view LED. FIG. 5 is a cross-sectional view cut along the line V-V of FIG. 4. In addition, FIG. 6 is an exploded view of FIG. 5.

As shown in FIGS. 4 to 6, a pair of reflective members 18a and 18b are installed around a concave 12 of a side-view LED 1, i.e., on an inner surface of a side wall 14. These reflective members 18a and 18b are made of a thinly plated high reflective metal. The reflective members 18a and 18b installed allow light generated from the LED chip 30 to be reflected forward in an arrow A direction, thereby enhancing light efficiency of the LED 1. Moreover, this produces heat release effects due to light not absorbed in the inner surface of the wall 14.

However, such a reflection structure entails following drawbacks. The thinly plated reflective members 18a and 18b are hardly installable in the narrow concave 12. Also, in order to be attached to the inner surface of the wall 14, the reflective members 18a and 18b should be shifted in an arrow B direction of FIG. 6 to be adhered and/or compressed. This potentially mars not only the wall 14 but also the LED chip 30, wires W and even reflective members 18a and 18b.

Furthermore, the reflective members 18a and 18b, which contact the lead frames 20 and 22, cannot be formed in a single structure. That is, the reflective members 18a and 18b should be spaced apart from each other at a predetermined distance G. This augments the number of parts and components and complicates work process. In addition, the conventional side-view LED experiences decrease in reflective efficiency due to light absorbed in the gap G.

SUMMARY OF THE INVENTION

The present invention has been made to solve the foregoing problems of the prior art and therefore an object according to certain embodiments of the present invention is to provide a side-view LED having an LED window opened to a side thereof to emit light sideward, thereby enhancing light efficiency and light release efficiency.

Another object according to certain embodiments of the invention is to provide a side-view LED having a reflection structure formed by depositing a high reflective metal on an inner surface of an inner wall, thereby achieving excellent reflectivity and heat release effects.

Further another object according to certain embodiments of the invention is to provide a side-view LED having a reflection structure by depositing a high reflective metal on an inner surface of an inner wall, thereby preventing damage in the side-wall and LED chip caused by pressure from a physical reflection structure as in the prior art.

According to an aspect of the invention for realizing the object, there is provided a side-view light emitting diode having a light emitting diode window opened to a side to emit light sideward, the light emitting diode comprising: a pair of lead frames each acting as a terminal; a light emitting diode chip attached to a portion of the lead frame and electrically connected thereto; a package body housing the lead frames and having a concave formed around the light emitting chip, the concave acting as the light emitting diode window; a high reflective metal layer formed integrally on a wall of the concave; a transparent encapsulant filled in the concave to encapsulate the LED chip, while forming the light emitting diode window; and an insulating layer formed on a predetermined area of the lead frames so that the lead frames are insulated from the high reflective metal layer.

Preferably, the insulating layer is formed in a joint between the lead frames and the metal layer.

Preferably, the insulating layer comprises one selected from a group consisting of $SiO_2$, SiN and $Al_2O_3$ and mixtures thereof. Preferably, the insulating layer comprises a deposited coating.

Preferably, the high reflective metal layer comprises one selected from a group consisting of Ag, Al, Au, Cu, Pd, Pt, Rd and alloys thereof. Preferably, the high reflective metal layer comprises a deposited coating.

Also, the side-view emitting diode further comprises an intermediate layer interposed between the high reflective metal layer and the wall. Preferably, the intermediate layer comprises one selected from a group consisting of $SiO_2$, SiN and $Al_2O_3$ and mixtures thereof. More preferably, the intermediate layer comprises a deposited coating.

The side-view emitting diode further comprises a passivation film formed on the high reflective metal layer. Preferably, the passivation film comprises a transparent insulator. More preferably, the passivation film comprises one selected from a group consisting of SiO2, SiN and $Al_2O_3$ and mixtures thereof. Much more preferably, the passivation film comprises a deposited coating.

In addition, preferably, the package body comprises a transparent resin and/or an opaque resin.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
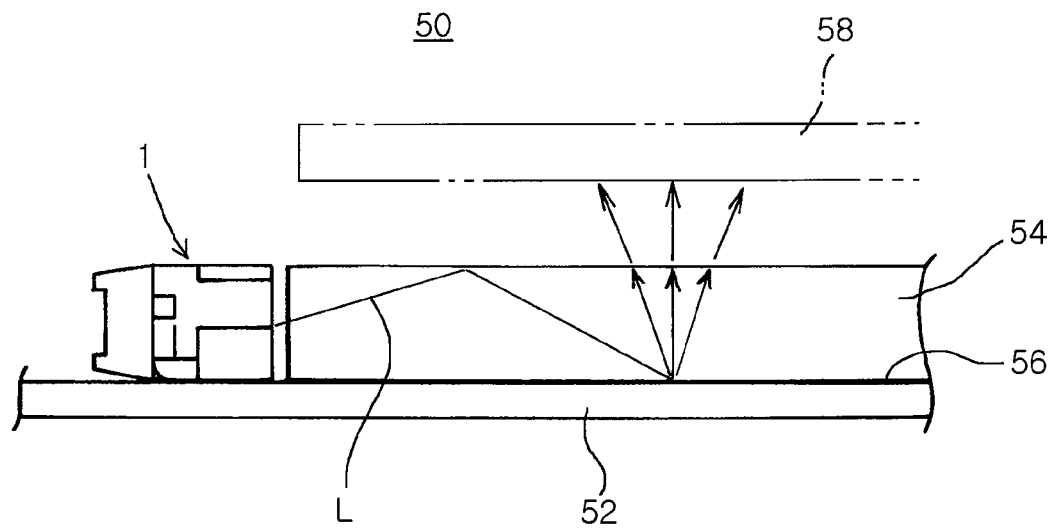
FIG. 1 is a cross-sectional view illustrating a conventional backlight inverter employing a side-view LED as a light source.
Figure 2:
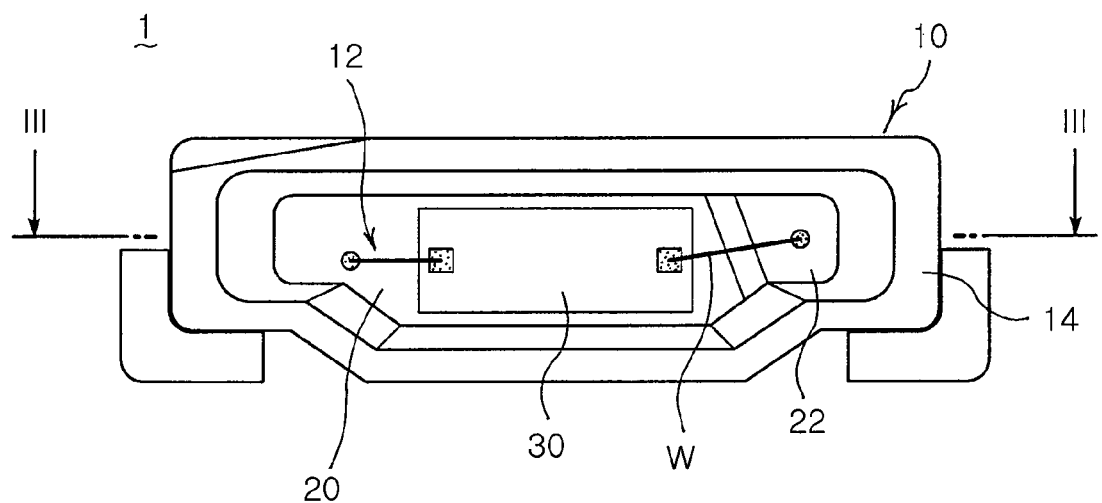
FIG. 2 is a front view illustrating an example of a conventional side-view LED.
Figure 3:
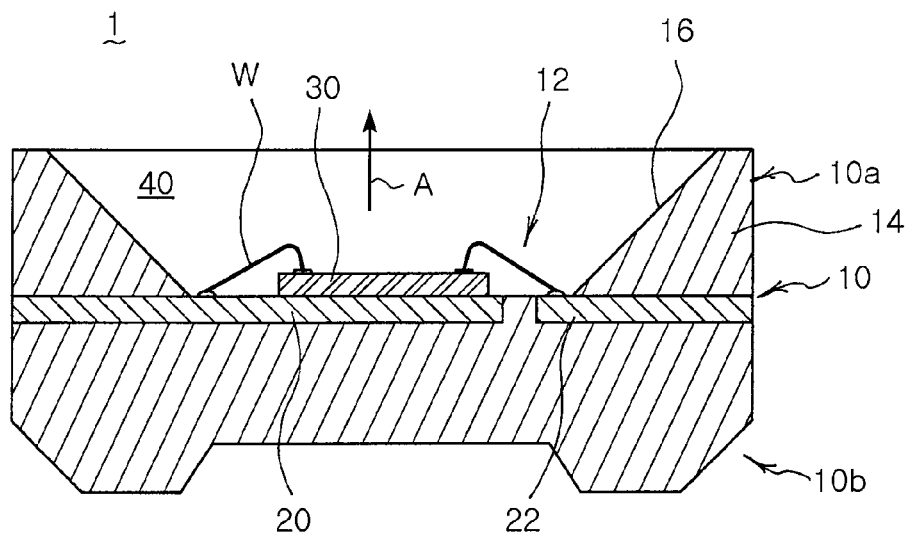
FIG. 3 is a cross-sectional view cut along the line III-III of FIG. 2.
Figure 4:
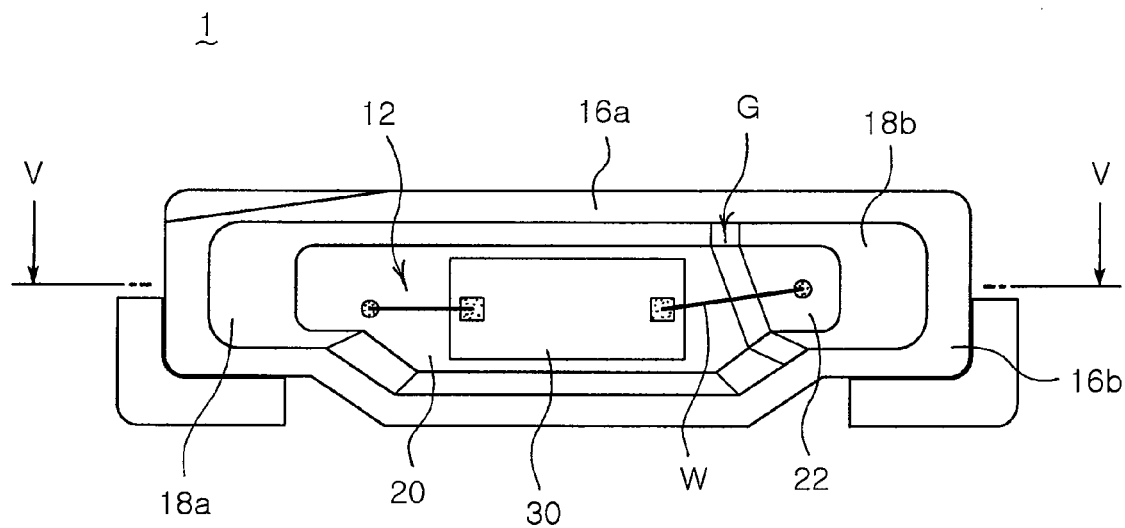
FIG. 4 is a front view illustrating another example of a conventional side-view LED.
Figure 5:
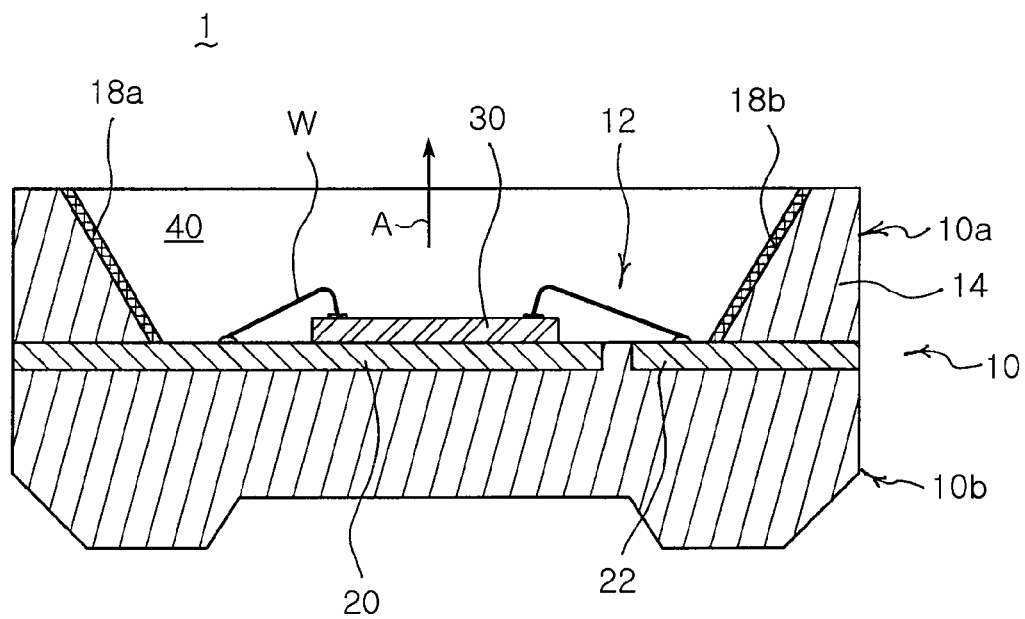
FIG. 5 is a cross-sectional view cut along the line V-V of FIG. 4.
Figure 6:
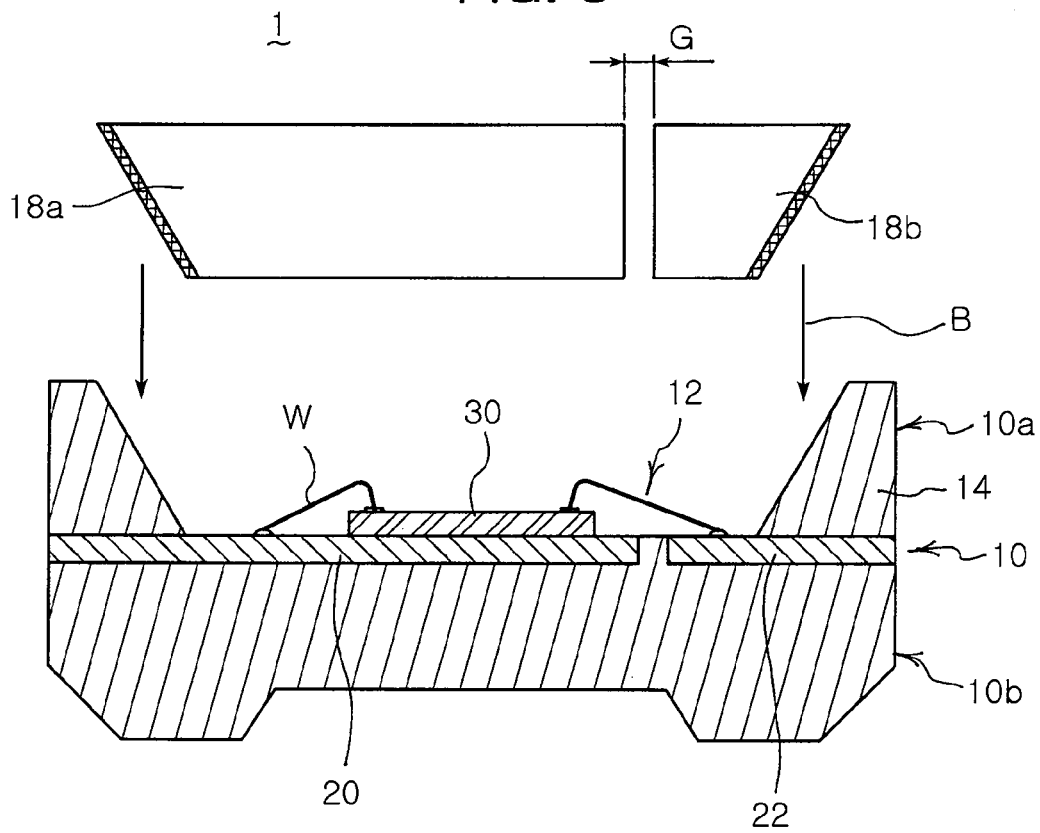
FIG. 6 is an exploded view of FIG. 5.
Figure 7:
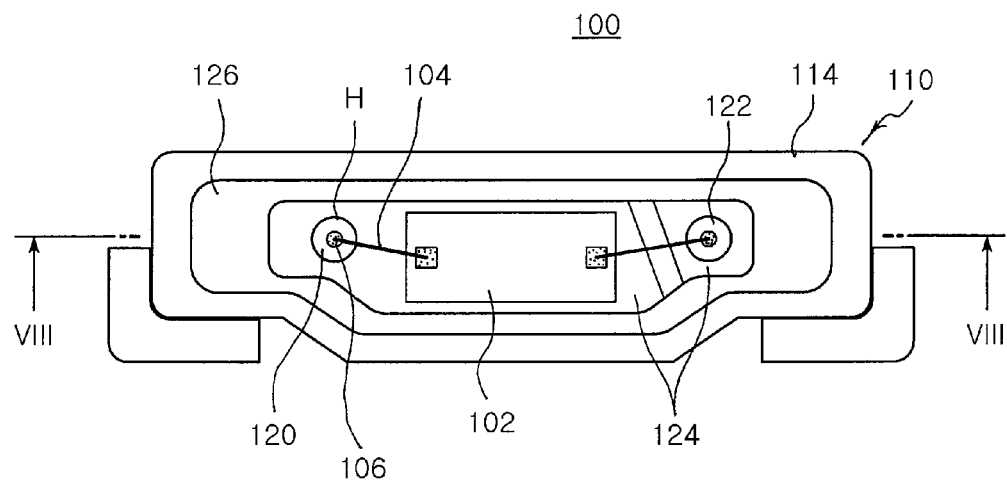
FIG. 7 is a front view illustrating a side-view LED according to a first embodiment of the invention.

First, an explanation will be given hereunder about a side-view LED having a side-wall reflection structure of the invention with reference to FIGS. 7 and 8. FIG. 7 is a front view illustrating the side-view LED according to a first embodiment of the invention and FIG. 8 is a cross-sectional view cut along the line VIII-VIII of FIG. 7.

Figure 8:
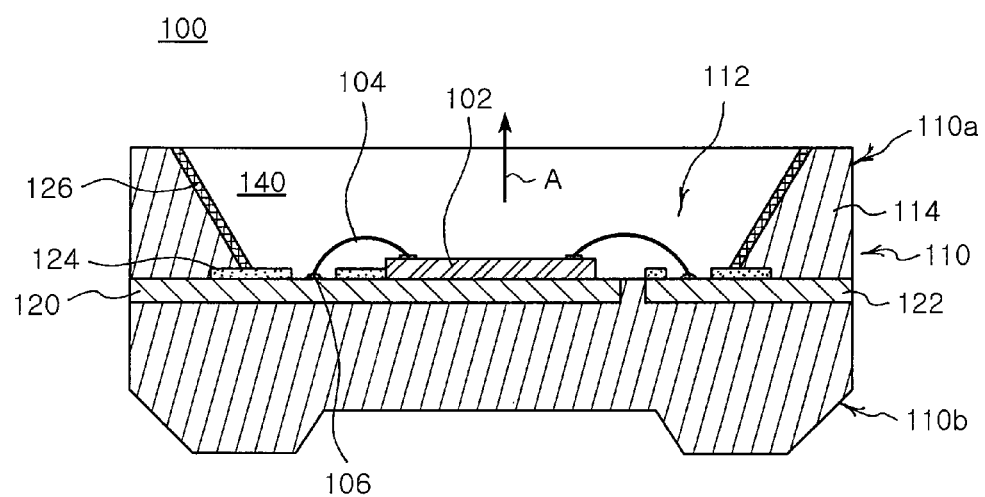
FIG. 8 is a cross-sectional view cut along the line VIII-VIII of FIG. 8.

As shown in FIGS. 7 and 8, the side-view LED 100 according to the first embodiment of the invention has an LED window opened to a side to emit light sideward. The side-view LED 100 is mounted in a backlight device as described above.

The side-view LED 100 includes a pair of lead frames 120 and 122, an LED chip 102, a package body 110, a high reflective metal layer 126, a transparent encapsulant 140 and an insulating layer 124. The pair of lead frames 120 and 122 each act as a terminal. The LED chip 102 is attached to a portion of the lead frames 120 and 122 and electrically connected thereto. The package body 110 houses the lead frames 120 and 122 and has a concave 112 formed around the LED chip. Also, the high reflective metal layer 126 is formed integrally on a wall 114 of the concave 112. The transparent encapsulant 140 is filled in the concave 112 to encapsulate the LED chip 102, while forming the LED window. In addition, the insulating layer 124 is formed on a predetermined area of the lead frames 120 and 122 so that the lead frames are insulated from the high reflective metal layer 126. The LED chip 102 attached to the lead frame 120 is electrically connected to the lead frames 120 and 122 via wires 106. The wires 106 are bonded to the LED chip 102 and the lead frames 120 and 122 via solders 104.

Meanwhile, the insulating layer 124 is formed on a predetermined area of the lead frames 120 and 122 so that the LED chip 102 can be mounted and the solders 104 are applied in the remaining area thereof. That is, in an area where the LED chip 102 is mounted, the insulating layer 124 is not formed. Also, as shown in FIG. 7, the insulating layer 124 is not formed in a round opening area H where the solders 104 are applied.

The insulating layer 124 is made of one selected from a group consisting of $SiO_2$, SiN, $Al_2O_3$ and mixtures thereof. Preferably, the insulating layer 124 is formed via deposition such as sputtering and electronic beam method. This produces the insulating layer 124 having a thickness of several Å to several µm. However, the insulating layer 124 has a thickness that enables electrical insulation between the lead frames 120 and 122 and the reflective layer 126 without specific limits. The reflective layer 126 is made of a high reflective metal, i.e., one selected from a group consisting of Ag, Al, Au, Cu, Pd, Pt, Rd and alloys thereof. Such a metal is deposited to a thickness of several Å to several µm on the inner surface of the side wall 114 via sputtering or electronic beam method to form the reflective layer 126.

This allows the reflective layer 126 to exhibit a reflectivity of substantially 90% or more. Therefore light projected onto the side wall 114 from the LED chip 102 is reflected forward, i.e., in an arrow A direction. The reflective layer 126 exhibits a reflectivity higher than that of resin of the package body 110. Thus, the LED 100 of the invention ensures much higher reflection efficiency of the inner wall than the conventional LED, thereby enhancing light efficiency. Furthermore, the thickness of the insulating layer 126, which is formed via deposition, accordingly can be precisely adjusted and extremely reduced.

In addition, since the insulating layer 126 reflects light generated from the LED chip 102 forward along with the lead frames 120 and 122, the light generated from the LED chip 102 rarely reaches the package body 110. This allows the package body 110 to be made of a transparent resin as in the transparent encapsulant 140. Advantageously, the package body 110 made of the transparent resin assures good aesthetic appearance.

Meanwhile, in case where the LED chip 102 is a short wavelength LED chip, the transparent encapsulant 140 may contain fluorescent material which converts a short wavelength light generated into a multi-wavelength light, i.e., a multi-color light. Alternatively, the transparent encapsulant 140 may contain ultraviolet ray absorbent/modifier and diffuser.

Figure 9:
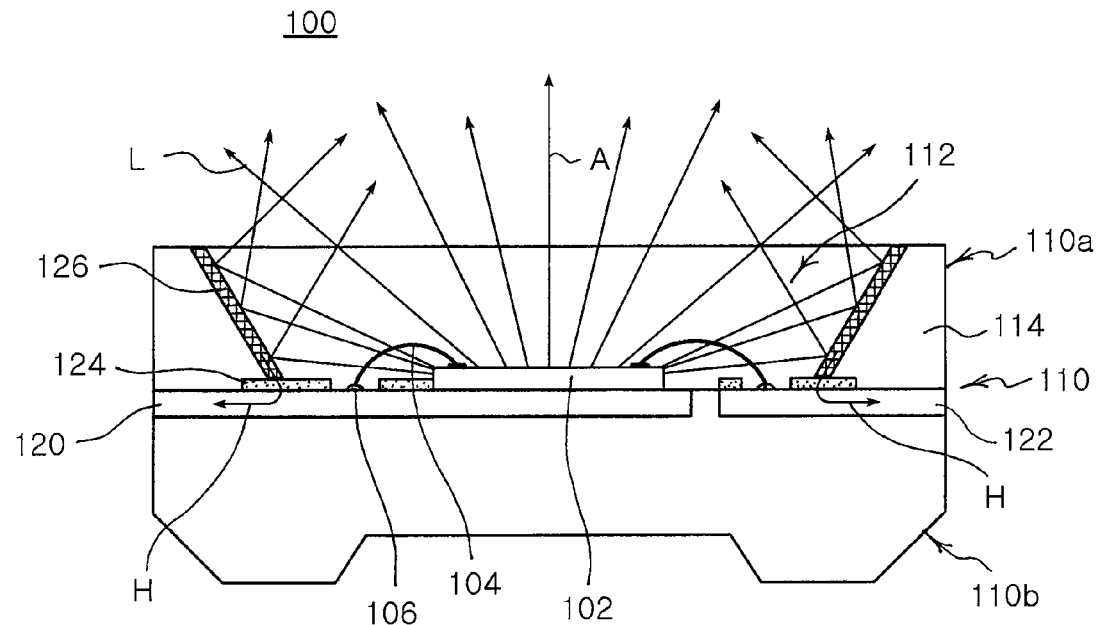
FIG. 9 is a cross-sectional view for explaining reflection and heat release by a reflective layer in the side-view LED according to a first embodiment of the invention.

An explanation will be given hereunder about reflection and heat release by the reflective layer in the side-view LED according to a first embodiment of the invention with reference to FIG. 9.

With the LED chip 102 activated, light L generated exits forward (indicated with A) and outward through the LED window, i.e., the transparent encapsulant 140. Also, light exiting sideward or backward is reflected by the lead frames 120 and 122 or the reflective layer 126 and exits forward A and outward. At this time, the reflective layer 126 with high reflectivity enhances light efficiency of the LED 100 as described above.

Moreover, some portion of light absorbed in the reflective layer 126 is converted into heat. The heat is transferred to the lead frames 120 and 122 along the reflective layer 126 as indicated with H. At this time, the insulating layer 124 between the reflective layer 126 and lead frames 120 and 122 blocks heat flow with a negligible effect due to extremely small thickness thereof. In this fashion, the reflective layer 126 boosts light efficiency and heat release efficiency of the LED 100.

Figure 10:
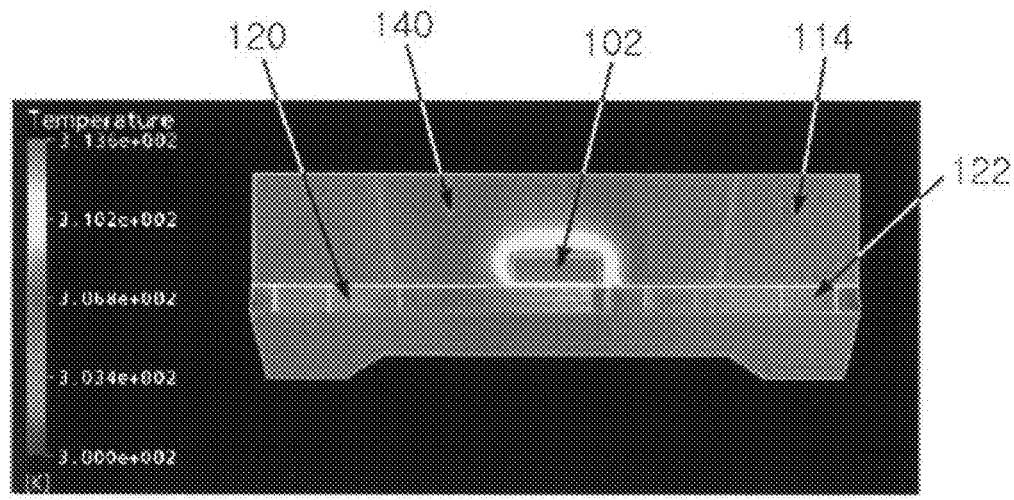
FIG. 10 illustrates heat distribution of the side-view LED in operation according to a first embodiment of the invention.
Figure 11:
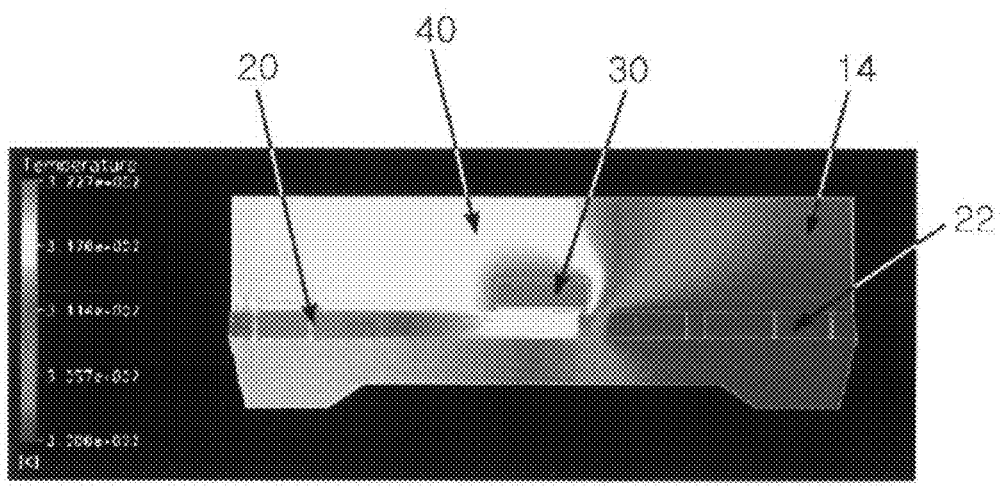
FIG. 11 illustrates heat distribution of the side-view LED in operation according to the prior art.

Then, heat release effect of the side-view LED will be compared with the conventional one with reference to FIGS. 10 and 11. FIG. 10 is a picture illustrating heat distribution of the side-view LED in operation according to a first embodiment of the invention. FIG. 11 is a picture illustrating heat distribution of the side-view LED in operation according to the prior art.

As shown in FIG. 10, in the side-view LED of the invention, heat is generated less when light from the LED chip strikes the side wall 114, and also exits easily through the reflective layer to the lead frames 120 and 122. This keeps the side wall 114 and transparent encapsulant 140 at a uniform temperature, which is however lower than those of the conventional LED.

In addition, in the conventional side-view LED of FIG. 11, the transparent encapsulant 40 has a considerably high temperature and the lead frame 22 having an LED chip 30 mounted thereon exhibits a wide temperature gap with respect to the other lead frame 22.

Such a side-view LED of the invention demonstrates superior light efficiency and higher heat release efficiency.

Figure 12:
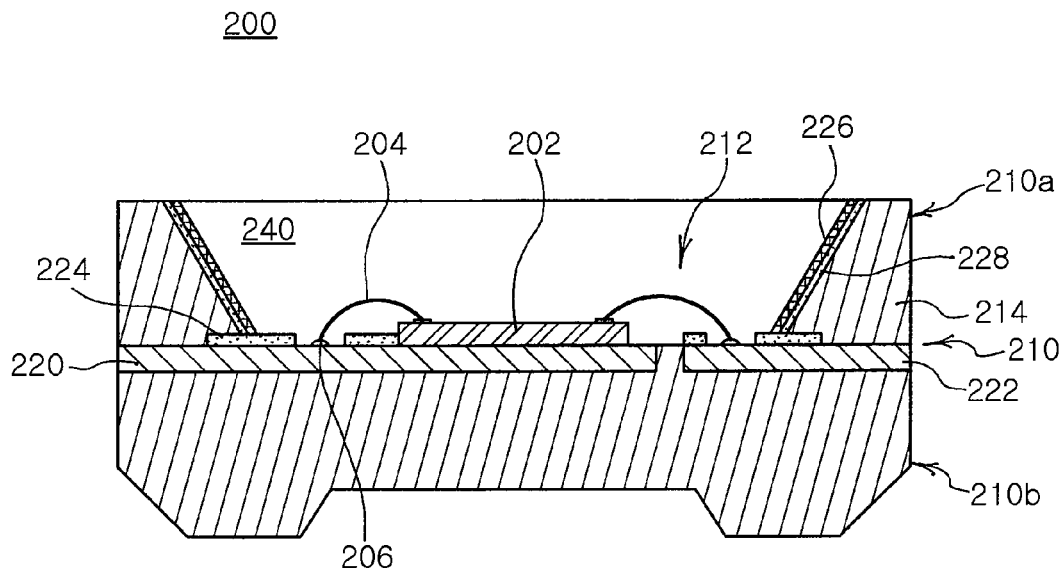
FIG. 12 is a cross-sectional view illustrating a side-view LED corresponding to FIG. 8 according to a second embodiment of the invention.

FIG. 12 is a cross-sectional view of a side-view LED corresponding to FIG. 8 according to a second embodiment of the invention.

As shown in FIG. 12, the side-view LED 200 according to the second embodiment of the invention is equal to the side view LED 100 according to the first embodiment of the invention except for an intermediate film 228 formed between a side wall 214 and a reflective layer 226. Therefore, the same components were given numeral signs that increased by 100 s and will not be explained further.

The intermediate film 228 is made of an insulator selected from a group consisting of $SiO_2$, SiN, $Al_2O_3$ and mixtures thereof. The intermediate film 228 is applied before forming of the reflective layer 226, preferably via deposition such as sputtering and electronic beam method. This allows the intermediate film 228 to have even a thickness of several Å to several µm.

The intermediate film 228 formed facilitates growth of the reflective layer 226. That is, in case where metal is directly deposited on an inner surface of a resin side wall 214, it may be poorly adhered to the side wall 214 depending on the type of metal. However, in case where an insulating intermediate film 228 is formed first and metal is deposited thereon, the metal can be highly bonded to the intermediate layer 228, thereby producing the excellent reflective layer 226.

Meanwhile, some resin such as LCP allows metal to be easily deposited, thereby obtaining the excellent reflective layer 226 made of one selected from a group consisting of Ag, Al, Au, Cu, Pd, Pt, Rd and alloys thereof.

Figure 13:
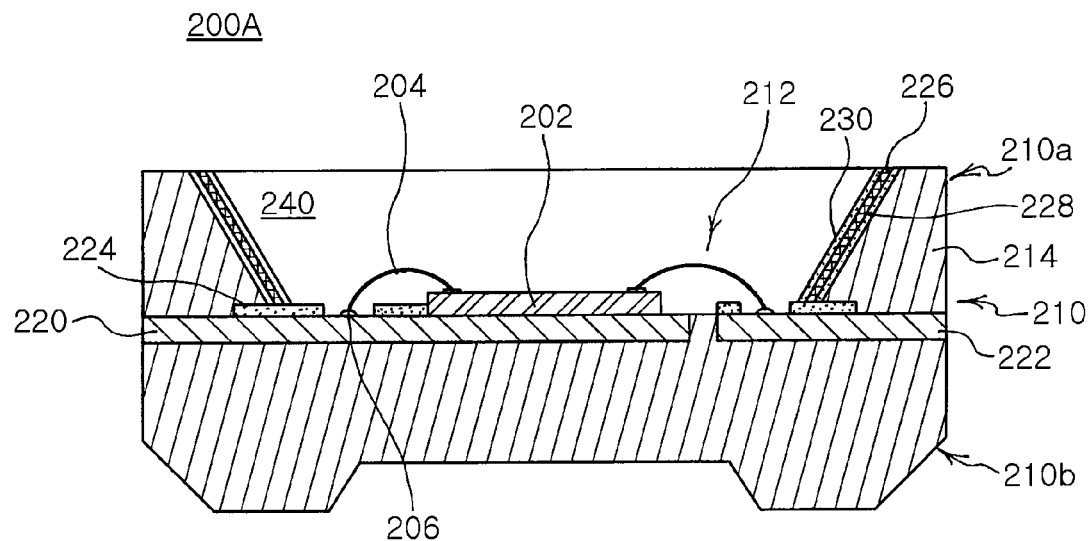
FIG. 13 is a cross-sectional view illustrating a side-view LED corresponding to FIG. 8 according to a third embodiment of the invention.

Then, FIG. 13 is a cross-sectional view of a side-view LED corresponding to FIG. 8 according to a third embodiment of the invention.

As shown in FIG. 13, the side-view LED 200A according to the third embodiment of the invention is equal to the side-view LED 200 except for a passivation film 230 formed on the reflective layer 226. Therefore the same components were given numeral signs that increased by 100 s and will not be explained further.

The passivation film 230 formed on the reflective layer 226 is made of an insulating material selected from a group consisting of $SiO_2$, SiN, $Al_2O_3$ and mixtures thereof like the intermediate film 228. Preferably, the passivation film 230 is disposed to a thickness of several Å to several µm via sputtering and electronic beam method.

The passivation film 230 serves to prevent debonding of the reflective layer 226. To manufacture the LED 200, a reflective layer 226 is formed and an LED chip is mounted. Then a transparent resin is poured into a concave 212 to form a transparent encapsulant 240. But some metal deposited, if in direct contact with resin, may fall off into the resin. This potentially degrades quality of the reflective layer 226 and transparency of the resin encapsulant 240. Therefore, the passivation film 230 is formed on the metal reflective layer 226 to prevent metal from falling off into the resin, thereby enhancing quality and stability of the metal reflective layer 226.

Figure 14:
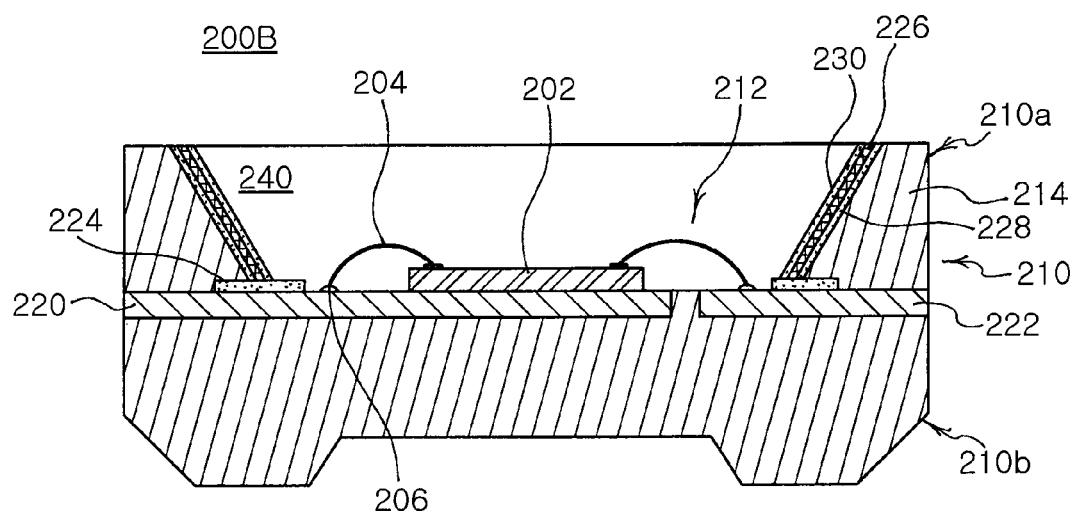
FIG. 14 is a cross-sectional view illustrating a side-view LED corresponding to FIG. 8 according to a fourth embodiment of the invention.

FIG. 14 is a cross-sectional view of a side-view LED corresponding to FIG. 8 according to a fourth embodiment of the invention.

As shown in FIG. 14, the LED 200B according to the fourth embodiment of the invention is distinguished from the LED 200A according to the third embodiment of FIG. 13 only in that an insulating layer 224 is formed on a joint between a reflective layer 226 and lead frames 220 and 222. Therefore, the same components were given numeral signs that increased by 100 s and will not be explained further.

The insulating layer 224 formed only on the joint between the reflecting layer 226 and the lead frames 220 and 222 allows easier soldering 206 than the first to third embodiments of the invention.

Meanwhile, as described above, some resin such as LCP allows metal to be easily deposited, thereby producing an excellent reflective layer 226 made of one selected from a group consisting of Ag, Al, Au, Cu, Pd, Pt, Rd and alloys thereof. Therefore, the LED of FIGS. 13 and 14 can also employ a structure in which the reflective layer 226 and passivation film 230 are formed on the side wall 214 without the intermediate film 228 formed.

FIGS. 15a to 15f illustrate in a stepwise fashion a method for manufacturing the side-view LED according to the invention.

Figure 15A:
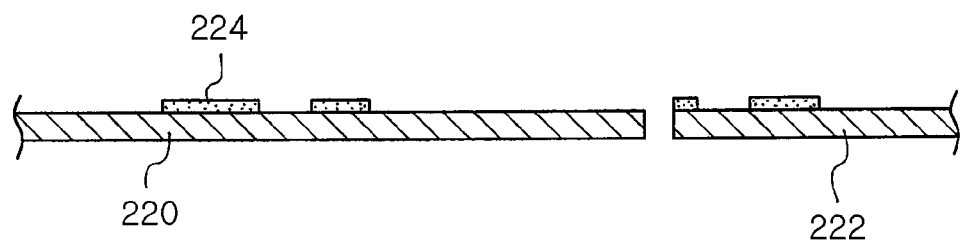
FIGS. 15a to 15f are cross-sectional views illustrating a process of manufacturing a side-view LED according to the invention.

First, as shown in FIG. 15a, lead frames 220 and 222 are prepared, and an insulating layer 224 is formed thereon with a predetermined pattern. The insulating layer 224 is formed to expose a predetermined area of the lead frames 220 and 222. Alternatively, the insulating layer 224 is formed on a predetermined area of the lead frames 220 and 222. That is, the insulating layer 224 is formed so that the LED chip 202 is mounted and solders 206 are provided in the remaining area in the following process (see FIG. 15f).

The insulating layer 224 is made of one selected from a group consisting of $SiO_2$, $SiN$, $Al_2O_3$ and mixtures thereof, preferably via sputtering and electronic beam method. This allows the insulating layer 224 to have even a thickness of several Å to several μm.

Alternatively, the insulating layer 224 is formed via etching or lift-off.

In the case of etching, an insulating material is deposited on an entire surface of a subject, or an entire area of lead frames 220 and 222. Then, the insulating material is etched with a predetermined pattern by using a PR pattern as a mask, and the PR pattern is removed to obtain an insulating layer of a desired pattern.

In the case of lift-off, the PR pattern is first adhered onto a surface of a subject and an insulating material is deposited only in an opening area of the PR pattern by using the PR pattern as a mask. Then the PR pattern is removed to obtain an insulating layer of a desired pattern.

Figure 15B:
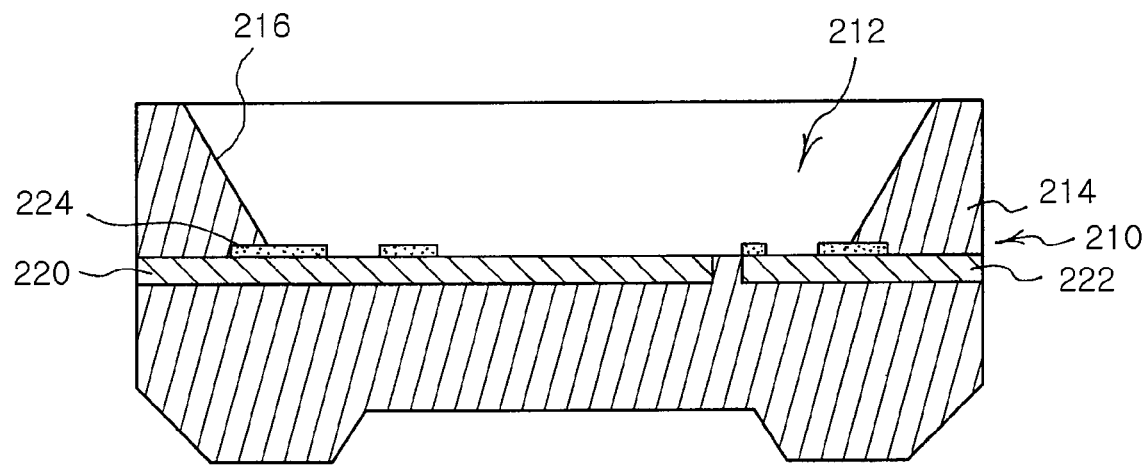

When the insulating layer 224 is formed, resin is injected via mold to form a package body 210 as shown in FIG. 15b. A conventional opaque resin and a transparent resin can be adopted for the resin for the package body 210.

Figure 15C:
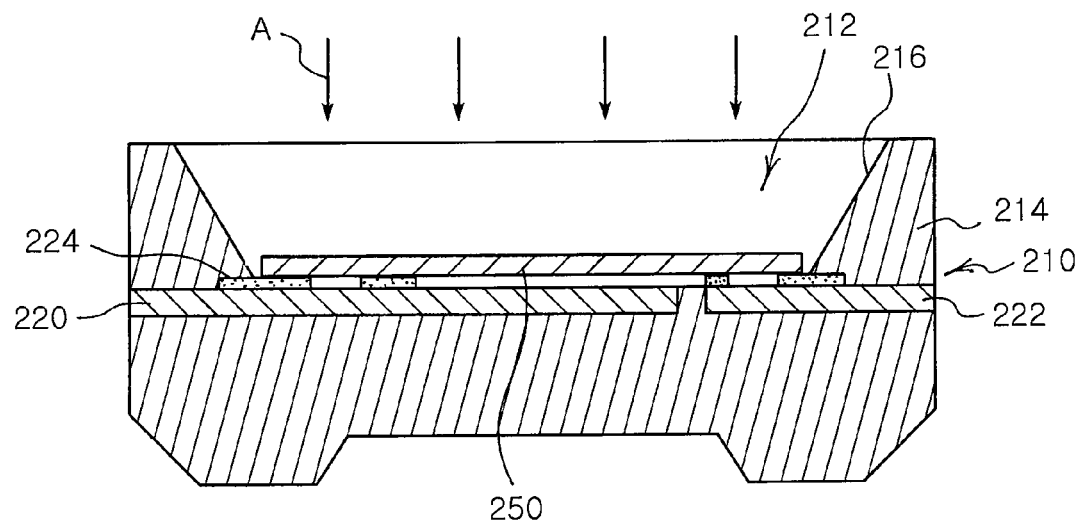

Thereafter, as shown in FIG. 15c, a screen 250 is placed on a bottom of a concave 212. Then, an insulator selected from $SiO_2$, $SiN$ and $Al_2O_3$ is deposited on an inner surface 216 of a side wall 214 to form an intermediate film 228 (refer to FIG. 15d) as indicated with an arrow A. At this time, preferably, the screen 250 is spaced apart from the inner surface 216 at a predetermined distance. Preferably, the screen 250 has a thickness equal to that of the intermediate layer 228, which ranges from several Å to several μm.

Figure 15D:
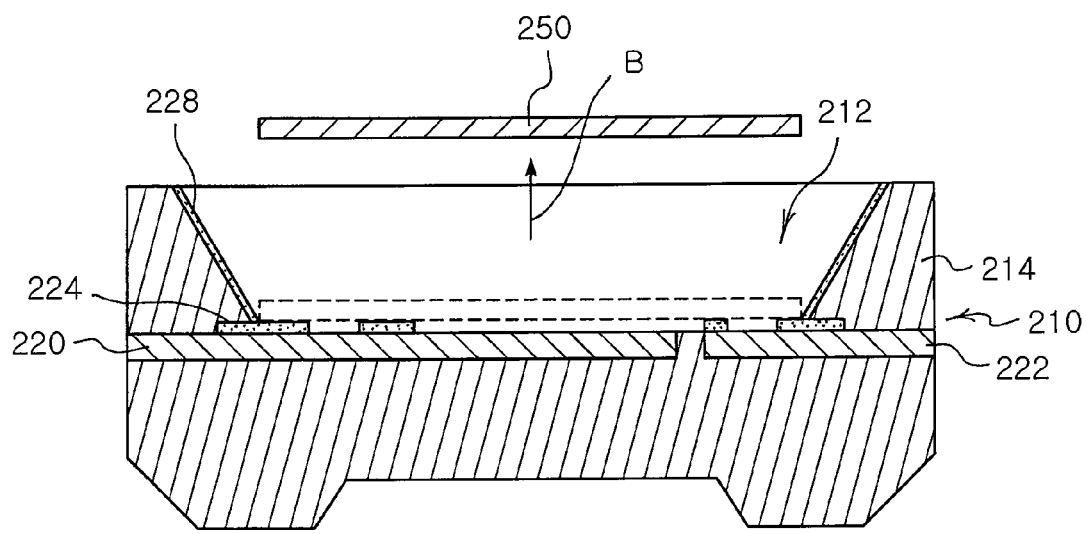

With the intermediate film 228 formed, the screen 250 is removed in an arrow B direction as shown in FIG. 15d.

Figure 15E:
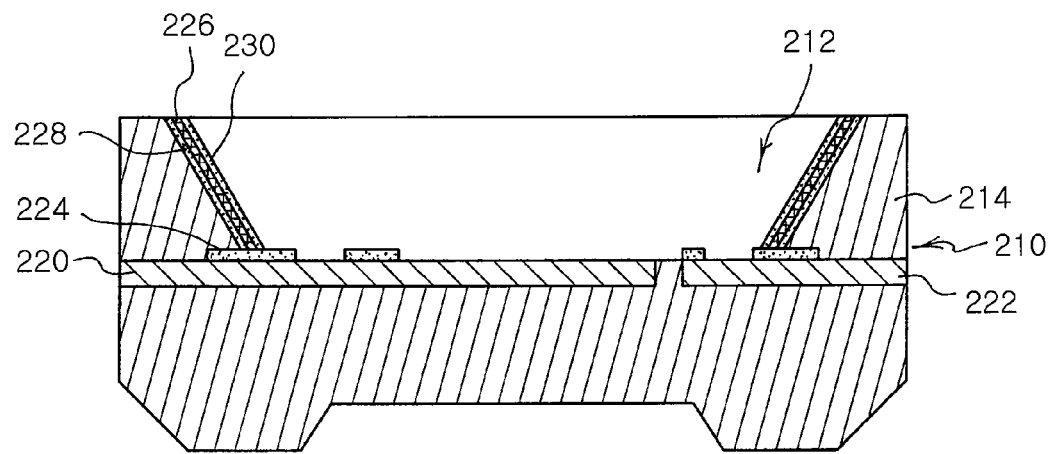

Next, processes similar to those of FIGS. 15c and 15d are repeated to form the reflective layer 226 and passivation layer 230 sequentially (refer to FIG. 15e).

Figure 15F:
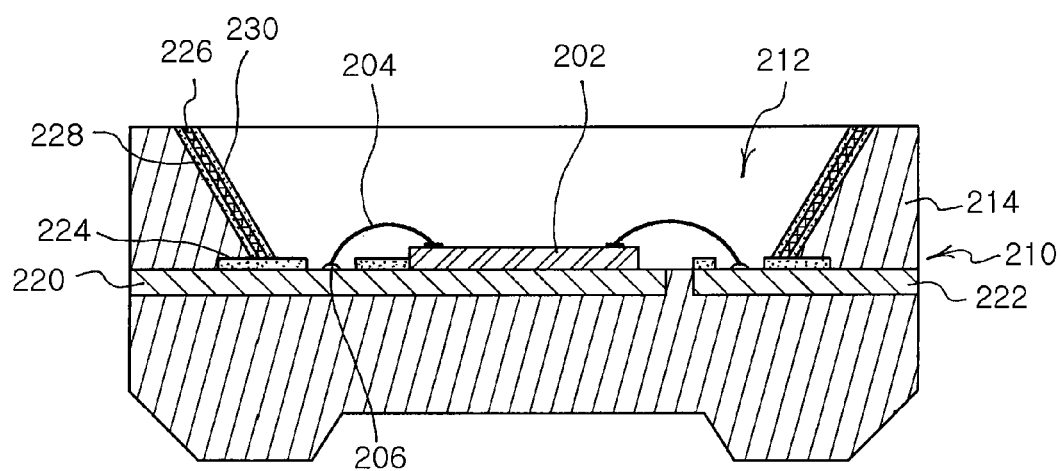

As shown in FIG. 15f, the LED chip 202 is mounted on an opening area of the lead frames 220, and wired 204 and soldered 206 to electrically connect to the lead frames 220.

Then, a transparent resin is poured into the concave 212 and cured therein, thereby producing the LED 200B of the invention as shown in FIG. 14.

The manufacturing method of the LED as just described is not only applicable to the LED 100, 200, 200A of the first to third embodiments of the invention but also applicable to other modifications. For example, the manufacturing method of the LED is equally applicable to a modified structure in which the reflective layer 126, 226 is directly formed on the side wall 114, 214 of the LED and a passivation film is formed thereon.

As set forth above, according to certain embodiments of the invention, a reflective layer deposited on an inner surface of a side wall of an LED exhibits excellent reflectivity, thereby boosting light efficiency of the LED. Also, the reflective layer has superior heat release efficiency, thereby improving heat release properties of the LED. In addition, the reflective layer formed via deposition prevents damage in the side wall and LED chip, which is caused by squeezing a plate metal in a narrow concave.

While the present invention has been shown and described in connection with the preferred embodiments, it will be apparent to those skilled in the art that modifications and variations can be made without departing from the spirit and scope of the invention as defined by the appended claims.

What is claimed is:

1. A manufacturing method of a side-view light emitting diode comprising: preparing lead frames and forming an insulating layer thereon having a pattern; forming a package body having a concave recess after forming the insulating layer, the package body electrically insulating the lead frames from each other; forming a high reflective metal layer on an inner surface of a side wall of the concave recess after forming the package body, the high reflective metal layer being insulated from the lead frames by the insulating layer; mounting an LED chip on an opening area of the lead frames; and filling the concave recess with a transparent encapsulant to encapsulate the LED chip, wherein the concave recess is formed to expose portions of lead frames on the bottom surface thereof.

2. The method according to claim 1, wherein the insulating layer is formed by a deposing process.

3. The method according to claim 1, further comprising forming an intermediate layer on the inner surface of the side wall of the concave, so that the high reflective layer is highly bonded to the package body before forming the high reflective metal layer.

4. The method according to claim 3, wherein the intermediate layer is formed by a deposing process.

* * * * *